United States Patent [19]

Van Gorkom

[11] Patent Number: 5,270,611
[45] Date of Patent: Dec. 14, 1993

[54] ELECTRIC DISCHARGE ELEMENT

[75] Inventor: Gerardus G. P. Van Gorkom, Eindhoven, Netherlands

[73] Assignee: U.S. Philips Corporation, New York, N.Y.

[21] Appl. No.: 917,687

[22] Filed: Jul. 17, 1992

Related U.S. Application Data

[63] Continuation of Ser. No. 528,627, May 24, 1990, abandoned.

[30] Foreign Application Priority Data

Jun. 1, 1989 [NL] Netherlands .......................... 8901390

[51] Int. Cl.$^5$ .......................... H01J 29/70; H01J 43/06
[52] U.S. Cl. .................................. 313/422; 313/359.1; 313/103 R
[58] Field of Search .............. 313/103 R, 107.5, 422, 313/359.1, 363.1, 346 R; 250/423 R; 315/5.11, 111.81

[56] References Cited

U.S. PATENT DOCUMENTS

| Re. 26,138 | 1/1967 | Gabor | 313/359.1 X |
| 3,808,494 | 4/1974 | Hayashi et al. | 313/103 R |
| 4,879,496 | 11/1989 | Knapp et al. | 313/422 |

OTHER PUBLICATIONS

Radio Shack Dictionary of Electronics, 1974 p. 336.

Primary Examiner—Sandra L. O'Shea
Attorney, Agent, or Firm—Robert J. Kraus

[57] ABSTRACT

Electric discharge element comprising a cathode which cooperates with an electron duct cavity which is defined by walls of electrically insulating material having a secondary emission coefficient δ, which cavity has an output aperture, while electrode means which can be connected to a voltage source are provided for applying, in operation, an electric field across a path in the cavity from the cathode to the output aperture so as to enable electron transport through the cavity.

34 Claims, 4 Drawing Sheets

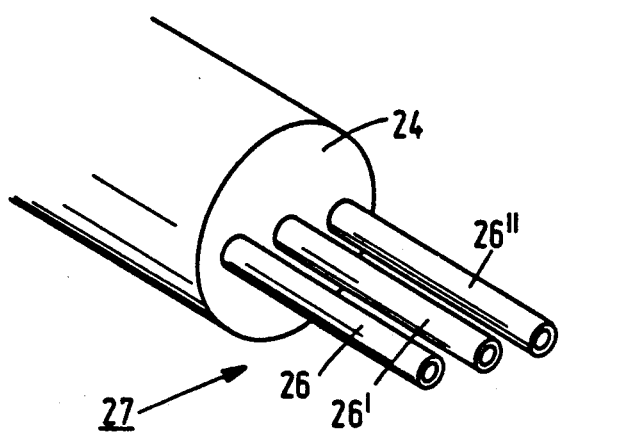
FIG.6
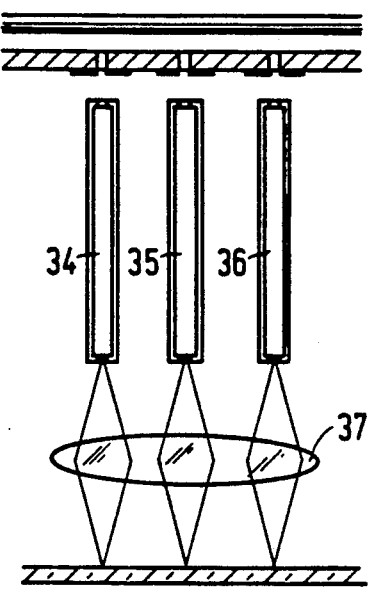
FIG.7  FIG.8
FIG.9
FIG.10

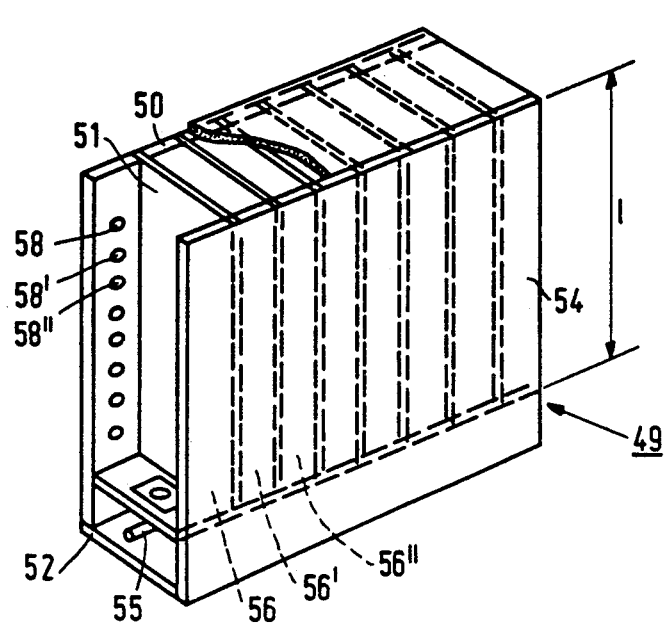
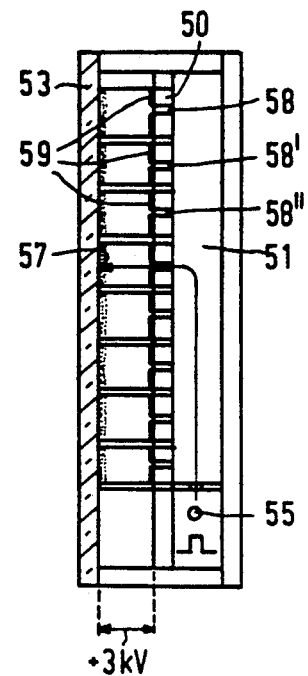
FIG. 11A  FIG. 11B
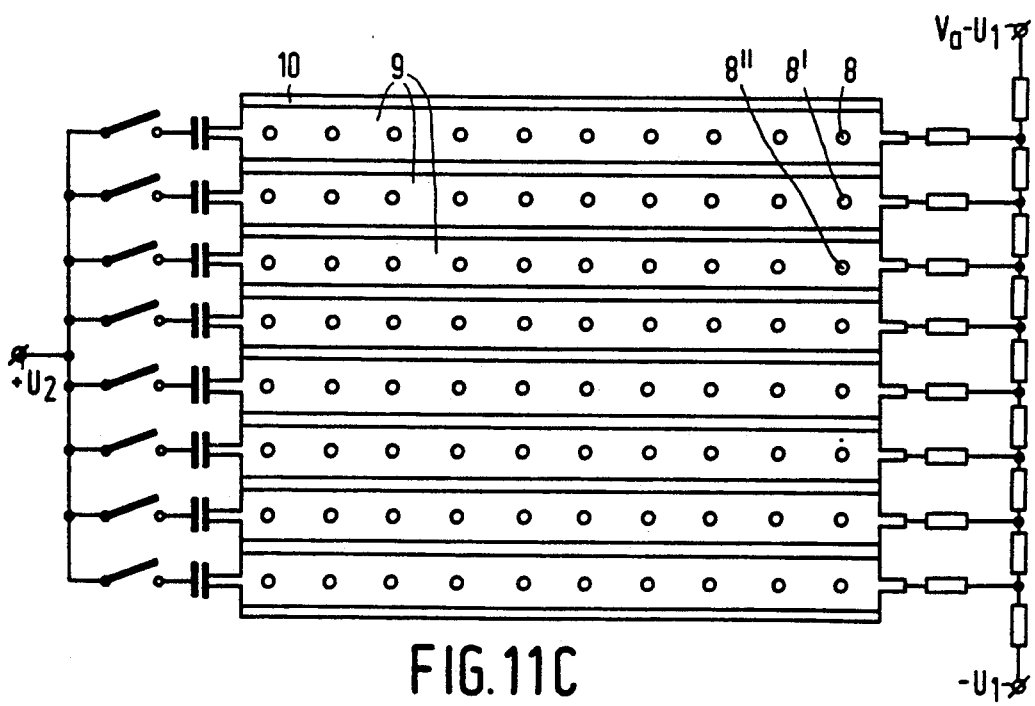
FIG. 11C

ELECTRIC DISCHARGE ELEMENT

This is a continuation of application Ser. No. 07/528,627, filed May 24, 1990 and now abandoned.

BACKGROUND OF THE INVENTION

The invention relates to an electric discharge element comprising an electron source. Conventional electric discharge elements such as, for example electron tubes do not have facilities of guiding electron beams in a localized way. Moreover, they have the limitation that their electron sources produce electron currents with a limited current density. For a number of applications it would be very interesting if electric discharge elements were available with facilities of guiding electron beams in a localized way or of supplying electron currents with a larger current density. Such applications are, for example (TV) display tubes, electron microscopes, electron beam lithography devices.

SUMMARY OF THE INVENTION

It is an object of the invention to comply with this wish. According to the invention an electric discharge element comprising an electron source is therefore characterized by a cathode having a surface for emitting electrons, which cathode cooperates with a vacuum electron duct which is formed by a cavity defined by walls of an electrically insulating material having a secondary emission coefficient $\delta$, which cavity has an output aperture, while electrode means which can be connected to a voltage source are provided for applying, in operation, an electric field with a field strength E across a path in the cavity from the cathode to the output aperture, $\delta$ and E having values which enable electron transport through the cavity.

The invention is based on the recognition that electron transport through cavities defined by walls of electrically insulating material (for example glass, ceramic material, Kapton polyamid material, Pertinax impregnated paper material etc.) is possible, provided that a sufficiently strong electric field is applied in the longitudinal direction of the cavity. The value of this field depends on the type of material and on the geometry and the sizes of the cavity walls. The electron transport then takes place via a secondary emission process so that for each electron impinging on a cavity wall one electron is emitted on an average.

The circumstances can thus be chosen to be such that substantially as many electrons enter the cavity as leave at the output again. A very advantageous vacuum electron duct can thus be realised.

The discharge element according to the invention may have a very simple construction if the cathode is located within the cavity of the electron duct. An interesting aspect of the latter embodiment is that if the output aperture defines an area $S_{out}$ which is smaller than the emissive surface area $S_{cath}$ of the cathode, the current density of the electron current leaving the output aperture is a factor of $S_{cath}/S_{out}$ larger than the current density of the cathode.

Alternatively, the cathode may be located outside the cavity of the electron duct and the cavity may have an input aperture facing the cathode. In a practical embodiment the emissive cathode surface and the surface of the input aperture are substantially equal.

To enable electron transport over a certain distance, it is practicable if the cavity has an elongate shape. This means that the electron duct may be a straight or bent pipe. In one embodiment the electrons from a cathode with an emissive surface area $S_{cath}$ are injected into the duct on one side. The input surface is area also $S_{in}$. Elsewhere in the duct there is an output aperture defining an area $S_{out}$. An electrically conducting electrode is provided on the outer side adjacent this aperture. The voltage difference $\Delta V$ between this electrode and the cathode provides the electric field required for the transport. Since in operation, the walls (substantially) cannot take up or supply any current, substantially as many electrons will enter the duct as will leave the output. For the current density $J_{out}$ at the output it then holds (if $J_{in}$ represents the current density at the input):

$$J_{out} = \frac{S_{cath}}{S_{out}} J_{in} \qquad (1)$$

If $S_{cath} >> S_{out}$, a large gain in current density is possible, in other words a discharge element can be realised in this way which can supply current with a large current density.

A further embodiment is characterized in that the cathode has means for modulating the electron current to be emitted. By modulating at a location where the current density is small, the modulation can be effected with a smaller voltage sweep than is possible in comparable conventional discharge tubes (with, for example a triode).

BRIEF DESCRIPTION OF THE DRAWING

Some embodiments illustrating the foregoing and further aspects of the invention will now be described in greater detail with reference to the accompanying drawings in which

FIG. 6 shows a plurality of electron ducts with a common cathode;

FIG. 7 shows a cathode which cooperates with an electron duct having a plurality of output apertures which can be electrically driven;

FIG. 8 shows an arrangement of a plurality of electron ducts cooperating with cathodes which can be separately driven;

FIG. 9 shows diagrammatically an electron microscope comprising an electric discharge element according to the invention;

FIG. 10 shows a cathode ray tube with an electric discharge element according to the invention;

FIGS. 11A, B and C show aspects of an electron beam addressing system; and

DESCRIPTION OF THE PREFERRED EMBODIMENTS

Figure 1:
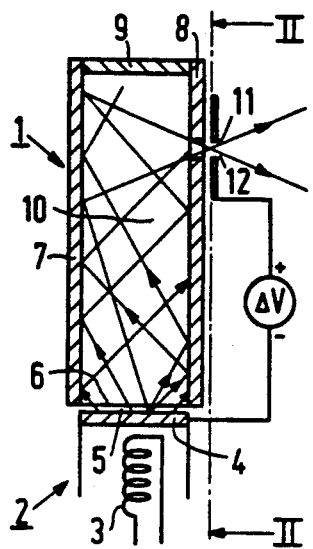
FIG. 1 is a diagrammatic cross-section of a part of an electric discharge element with a cathode and an electron duct according to the invention.
Figure 2:
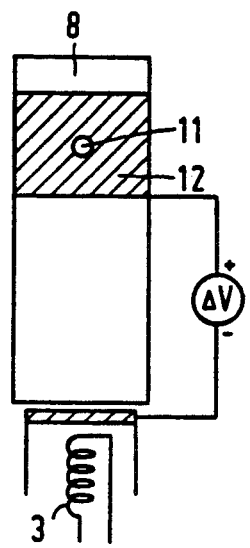
FIG. 2 is a side elevation of the construction of FIG. 1.
Figure 4:
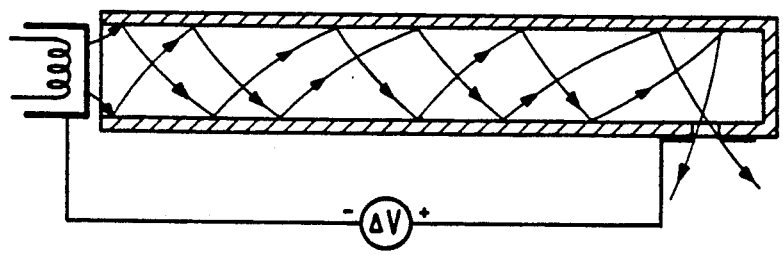
FIG. 4 illustrates the operation of an electron duct.
Figure 12:
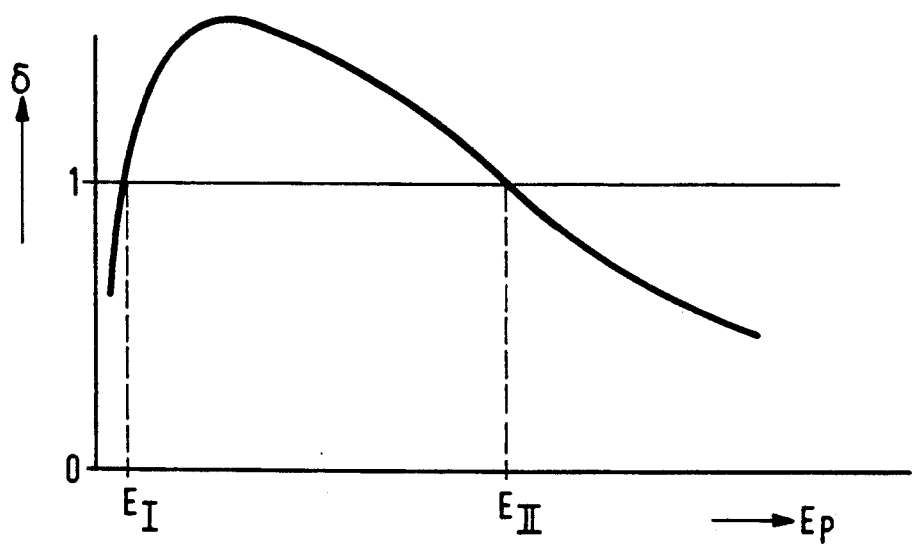
FIG. 12 is a graph in which the secondary emission coefficient $\delta$ is plotted as a function of the primary electron energy $E_p$ of a material suitable for the element according to the invention.

FIG. 1 is a diagrammatic cross-section of a part of an electric discharge element 1 comprising a cathode 2 having a filament 3 and an emitting layer 5 supported by a base 4. The emitting layer 5 has a surface area $S_{cath}$ with which it faces an input aperture 6 defining an internal surface area $S_{in}$ of an elongate cavity 10 of an electron duct surrounded by walls 7, 8, 9 of electrically insulating material. This material must have a relatively high resistance (the higher the resistance, the less power is required) and a secondary emission coefficient $\delta > 1$ (see FIG. 12) over at least a certain range $E_I$-$E_{II}$ of primary electron energies $E_p$. Preferably, $E_I$ is as low as possible, for example one or several times 10 eV. Inter alia, glass ($E_I$ is approximately 30 eV), ceramic material, Pertinax material, Kapton material meet this requirement. One of the walls (in this case wall 8) has an output aperture 11 defining an area $S_{out}$. An electrode 12 adjoins the aperture 11 (see also FIG. 2). A voltage difference $\Delta V$ is applied between the electrode 12 and the cathode 2 for generating an electric field in the longitudinal direction of the cavity 10. If this field has a sufficiently large strength (which also depends on the material of the walls and on the dimensioning of the cavity 10), electron transport through the (evacuated) cavity is possible. The electron transport is effected via a process of secondary emission in which for each electron impinging upon a wall one electron is emitted on an average (FIG. 4). Substantially as many electrons injected into the cavity 10 at the input aperture 6 leave the output aperture 11 because the electrically insulating walls have such a high resistance that they cannot produce or release any electrons at a substantial rate.

The construction shown in FIG. 1 thus represents a very advantageous device for transporting a localized electron current which can be used in many ways (a so-called electron fibre).

By rendering $S_{out} << S_{cath}$, the current density $J_{out}$ at the output 11 will be higher than the current density $J_{in}$ supplied by the cathode 2 so that an electron compressor is obtained which can be used in many ways.

However, for certain uses in which a luminescent material is excited, a luminosity parameter B which is proportional to $J/\Delta E$, in which $\Delta E$ is energy spread of the electrons, is important. It holds for the luminosity $B_{out}$ at the output (if $B_{in}$ is the luminosity at the input):

$$B_{out} = \frac{S_{in}(\Delta E)_{in}}{S_{out} \cdot (\Delta E)_{out}} \cdot B_{in}.$$

For most thermal cathodes in a triode configuration it holds that $\Delta E$ is approximately equal to 0.2 eV at low currents, while $\Delta E$ may increase to approximately 2 eV at currents of the order of mAs. The energy spread of the electrons leaving the output aperture 11 ($\Delta E)_{out}$ is approximately 4 eV in a given case. The ratio $(\Delta E)_{in}/(\Delta E)_{out}$ is in this case in the range between approximately ¼ and 1/20. Consequently, if $S_{in}/S_{out} > 2$ to 20, $B_{out} > B_{in}$.

Electron ducts with $S_{in}/S_{out} = 200$ have already been realised within the scope of the invention, but much higher values are possible. A gain in luminosity of 100-500 can then be realised. This means that the electron compressor proposed is very interesting for use in, for example TV display tubes, projection TV tubes, electron microscopes, electron beam lithography devices.

In addition to electron ducts without amplification the invention also relates to electron ducts with amplification. In the latter case the walls should be capable of supplying current. To this end they may have, for example, layers of a sufficiently high secondary emission coefficient so that current amplification by means of electron multiplication is possible. However, a problem is that the layers hitherto known with a sufficiently high secondary emission coefficient have a relatively short lifetime. For certain uses this need not be a problem. In that case it holds for the current density at the output $J_{out}$:

$$J_{out} = \frac{S_{cath}}{S_{out}} \cdot M \cdot J_{in}$$

in which M is the current amplification by multiplication. Analogously it holds for the luminosity at the output $B_{out}$:

$$B_{out} = \frac{S_{cath}(\Delta E)_{in}}{S_{out} \cdot (\Delta E)_{out}} \cdot M \cdot B_{in}.$$

It is to be noted that the electric discharge element according to the invention already operates at a relatively poor vacuum (provided that the cathode at the input operates); that the electon current at the input of the tube can be modulated with a much lower voltage sweep than is common practice (for example approximately 20 V instead of approximately 150 V) and that the cathode may be both a thermal cathode and a cold cathode like a field emitter or a p-n emitter.

Figure 3:
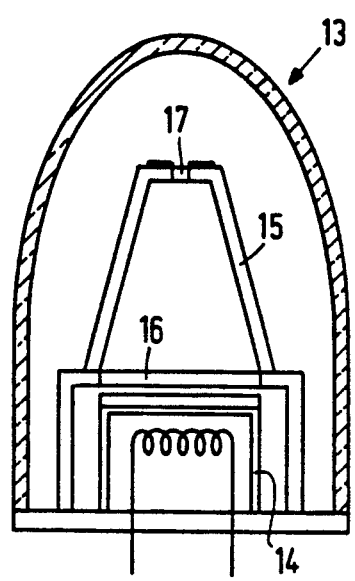
FIG. 3 is a diagrammatic cross-section of an electric discharge tube with a cathode and an alternative electron duct.

FIG. 3 shows an electric discharge tube 13 with a cathode 14 and electron duct cavity 15 of a different type than that of FIG. 1. The cavity 15 is tapered and has an output aperture 17 facing an input aperture 16.

Figure 5:
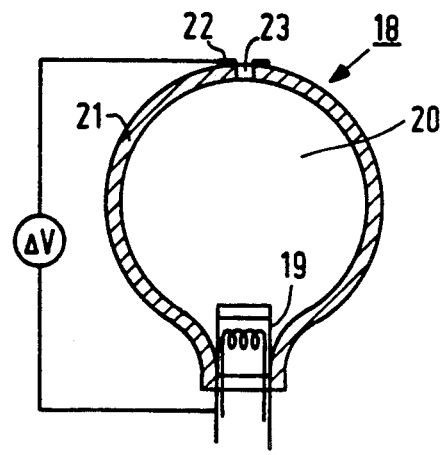
FIG. 5 shows an alternative embodiment of an electron duct.

FIG. 5 shows an electric discharge element 18 which can be constructed in a very simple way, in which a cathode 19 is arranged within an electron duct cavity 20. An output aperture 23 provided with an electrode 22 is present in an envelope wall 21 which is spherical in this case.

FIG. 6 shows an electron source 27 with a common cathode 24 which cooperates with a number (three in this case) of electron duct cavities 26, 26', 26''. Such a construction may be used, for example as an electron source for a colour display tube in which the cavities 26, 26', 26'' are successively brought to the electron transport mode (they are "driven") and the electron current emitted by the cathode 24 is modulated. An alternative is the use of a cathode 28 which cooperates with one electron duct cavity 29 which instead of one output aperture has a number (three in this case) of output apertures 30, 30', 30'' which are provided with electrodes 31, 32, 33 so as to optionally "open" or "close" them electrically (FIG. 7).

An arrangement of straight or curved, tapered or non-tapered electron ducts 34, 35, 36 each cooperating with their own cathode or with a common cathode may be used, for example for producing a number of electron spots on a small surface. FIG. 8 shows an arrangement of electron ducts 34, 35, 36 used in combination with an electron-optical lens 37. In this case the electron ducts 34, 35, 36 have input apertures 44, 45, 46 which cooperate with a cathode configuration 43 comprising a line cathode 47 which provides for three electron emitters which can be separately driven by means of electrodes 48, 48', 48" which can be separately driven. This arrangement may be advantageously used in a device for electron beam lithography.

FIG. 9 shows diagrammatically an electron microscope 39 and FIG. 10 shows a (projection) display tube 40 with a discharge element 41 and 42 of the above-described "electron compression" type as an electron source. An electron source which can produce a large current density may be very advantageous for electron microscopes and (projection) display tubes.

FIGS. 11a, b and c are elevational views of an electron beam addressing system whose use in a display tube is described in greater detail in U.S. patent application Ser. No. 528,677 filed simultaneously with this application on May 24, 1990.

A cathode arrangement, for example a line cathode 55 providing, for example 600 cathodes which can be separately driven is present proximate to the bottom of a wafer-shaped structure 49 with a rear wall 54. If necessary, a number of separate emitters, for example field emitters or p-n emitters may be used instead of a line cathode. Each of these emitters only needs to supply a current of pA or nA (dependent on the amplification) so that many types of (cold or thermal) cathodes are suitable. The emission of these cathodes can be modulated. A row of compartments 56, 56', 56", . . . etc. with one compartment per cathode, is arranged just above the row 55 of cathodes. These compartments have walls which are made of, for example, ceramic material or lead glass, which has a suitable electrical resistance for the present object, and which have a secondary emission coefficient $\delta > 1$ over a given range of primary electron energies. The electrical resistance should be so large that a minimum possible amount of current (less than, for example 10 mA) will flow in the walls when a voltage difference required for vacuum electron transport is applied across the length 1 (which may be, for example, in the range of 1 to 1000 m) of the compartments. The resistance across the length of the cathode-sided subportion of the compartment may be lower (for example, of the order of 100 times lower) than across the remaining portion of the compartment so as to obtain some amplification of the cathode current, but preferably the resistance across the length of the cathode-sided sub portion is also high (particularly in the range of $10^6$–$10^{15}\Omega$) and all required current is drawn from the cathode so that transport without amplification occurs. One of the walls of each compartment may be constituted by the rear wall 54. In that case the rear wall is, for example, a flat substrate in a surface of which a plurality of parallel cavities is formed.

A voltage of the order of kVs is applied in the longitudinal direction 1 across all compartments combined. By applying a voltage of, for example 50 to 100 V between the row 55 of cathodes and the compartments 56, 56', 56", electrons are accelerated from the cathodes to the compartments so that they generate secondary electrons in the compartments. The required voltage is dependent on the circumstances, but will generally have to be more than 30 V. The generated secondary electrons are accelerated again and generate new electrons. This is continued until saturation. (This saturation may be space charge saturation and/or it may be produced by field distortion). From the saturation point, which may be reached very soon, a constant vacuum current will flow through the relevant compartment (compare FIG. 4). If the wall material is high-ohmic enough, the walls of the compartments cannot produce or take up any net current so that this current, even in a close approximation, is equal to the entering current. If the electric field is made larger than the minimum value which is required to obtain a state with $\delta_{eff} = 1$, the following will happen. As soon as $\delta$ is slightly larger than 1, the wall inhomogeneously is charged positively (due to the very small conductance this charge cannot be depleted). As a result the electrons will reach the wall earlier than in the absence of this positive charge, in other words: the average energy taken up from the electric field in the longitudinal direction will be smaller so that a state with an effective secondary emission coefficient $\delta_{eff} = 1$ adjusts itself. This is a favourable aspect because the exact value of the field is not important as long as it is larger than the previously mentioned minimum value.

The compartment walls facing the rear wall 54 jointly constitute a "drive plate" 50 (see also FIG. 11B). This plate has apertures 58, 58', 58" . . . etc. Furthermore there is a row of drive electrodes 59 on the outer side of the drive plate 50. These row electrodes 59 may be implemented in the way shown in FIG. 11C (electrodes "across" the apertures) or in the way shown in FIG. 11C and may be incorporated in an electric circuit with a resistance divider. In the off-state of a drive electrode 59 a voltage $-U1$ relative to the local compartment potential is applied, which voltage ensures that the electrodes cannot leave the compartment at that location. If a picture line must be switched on, an extra potential $+U2$ is applied. In view of the fact that the electrons in the compartments have a relatively low velocity due to the collisions with the walls, U1 and U2 may be compartively low. In a certain case a value of 100 V for both U1 and U2 appeared to yield a good result.

FIG. 11B shows that electrons drawn by a drive electrode 59 from an electron guidance cavity 51 surrounded by compartment walls can be accelerated towards a target 57 so that one picture line at a time can thus be scanned.

It is to be noted that the structure 49 (see FIG. 11A), which constitutes, as it were, an electron beam addressing module, may be composed of separate components, for example a rear wall 54 with recesses and a front plate 50 with apertures, or it may alternatively be composed of one piece.

Furthermore it is to be noted that the walls which define the electron ducts may consist of an electrically insulating material which has a constructive function as well as a secondary emission function. Alternatively, they may consist of an electrically insulating material having a constructive function (for example, a synthetic material), on which material a layer having a secondary emission function is provided (for example, quartz or glass or ceramic material such as MgO).

I claim:

1. An electric discharge element for operating as an electron source, comprising:
   a. a cathode having a surface for emitting electrons;
   b. an evacuable electron duct having walls comprising an electrically insulating material having a secondary emission coefficient which is at least equal to one for a predetermined range of electron energies, said duct defining a cavity which is in communication with the cathode for receiving electrons emitted by said surface and having an output aperture for enabling transfer of electrons out of the duct;

c. electrode means positioned relative to the duct for producing within said cavity an electric field with a predetermined field strength for effecting the transport of electrons from the cathode to at least the vicinity of the output aperture by means of electron interactions with the duct walls at energies within said predetermined range.

2. An electric discharge element as claimed in claim 1, characterized in that the cathode surface is located within the cavity.

3. An electric discharge element as claimed in claim 1, characterized in that the cathode surface is located outside the cavity and in that the duct has an input aperture facing the cathode surface.

4. An electric discharge element as claimed in claim 1, 2 or 3, characterized in that the cavity has an elongate shape.

5. An electric discharge element as claimed in claim 3, characterized in that the cathode surface has an electron emitting area which is substantially equal to an area defined by the duct input aperture.

6. An electric discharge element as claimed in claim 3, characterized in that an area defined by the output aperture is smaller than an electron emitting area of the cathode surface.

7. An electric discharge element as claimed in claim 6, characterized in that in operation the current density of electrons leaving the output aperture is larger than the current density of electrons emitted by the electron emitting area of the cathode.

8. An electric discharge element as claimed in claim 6, characterized in that in operation the ratio of current density to energy spread for electrons leaving the output aperture is larger than said ratio for electrons emitted by the electron emitting area of the cathode.

9. An electric discharge element as claimed in claim 1, including means for modulating the current of electrons emitted by said cathode surface.

10. An electric discharge element as claimed in claim 4, characterized in that said output aperture is provided in a longitudinally extending wall of the duct.

11. An electric discharge element as claimed in claim 1, characterized in that a plurality of output apertures are provided in a longitudinally extending wall of the duct.

12. An electric discharge element as claimed in claim 11, characterized in that electrodes are provided proximate to the output apertures, which electrodes can be connected to energizing means for, in operation, applying a voltage for electrically opening or closing the apertures.

13. An electric discharge element as claimed in claim 12, characterized in that the electrodes which are proximate the output apertures can be separately energized to apply said voltages to selected ones of the output apertures.

14. An electric discharge element for operating as an electron source, comprising:
a. electron generating means for emitting electrons;
b. an evacuable electron duct having at least one inner surface defining a cavity which is in communication with the electron generating means for receiving electrons emitted by said means and having an output aperture for enabling transfer of electrons out of the duct, said at least one inner surface being formed, over a substantial length of the duct, from an insulating material having a secondary emission coefficient which is at least equal to one for a predetermined range of electron energies;
c. field producing means positioned relative to the duct for producing within said cavity an electric field with a predetermined field strength for effecting the transport of electrons from the electron generating means to at least the vicinity of the output aperture by way of electron interactions with said inner surface of insulating material at energies within said predetermined range.

15. An electric discharge element for operating as an electron source, comprising:
a. electron generating means for emitting electrons;
b. an evacuable electron duct having at least one inner surface defining a cavity which is in communication with the electron generating means for receiving electrons emitted by said means and having an output aperture for enabling transfer of electrons out of the duct, said at least one inner surface being formed, over a substantial length of the duct, from a first material having a secondary emission coefficient which, for a predetermined range of electron energies, is greater than one but is insufficiently high to promote electron multiplication in said duct;
c. field producing means positioned relative to the duct for producing within said cavity an electric field with a predetermined field strength for effecting the transport of electrons from the electron generating means to at least the vicinity of the output aperture by way of electron interactions with said at least one inner surface at energies within said predetermined range.

16. An electric discharge element as in claim 15, characterized in that said at least one inner surface includes a portion which is formed from a second material having a secondary emission coefficient which, for said predetermined range of electron energies, is sufficiently high to promote electron multiplication in a respective portion of said duct.

17. An electric discharge element as in claim 16, characterized in that said inner portion is disposed proximate the electron generating means.

18. An electric discharge element as in claim 1, 14 or 15, characterized in that said cavity has a cross-sectional area which increases with distance from the output aperture.

19. An electric discharge element as in claim 14 or 15, characterized in that the electron generating means includes an electron emitting portion which is located within the cavity.

20. An electric discharge element as in claim 14 or 15, characterized in that the electron generating means includes an electron emitting portion which is located outside of the cavity and where the duct has an input aperture facing said electron emitting portion.

21. An electric discharge element as in claim 14 or 15, characterized in that the cavity has an elongate shape.

22. An electric discharge element as in claim 21, characterized in that the cavity has a tubular shape.

23. An electric discharge element as in claim 22, characterized in that the cavity has a rectangular cross section.

24. An electric discharge element as in claim 20, characterized in that the electron generating means has an electron emitting surface area which is substantially equal to an area defined by the duct input aperture.

25. An electric discharge element as in claim 20, characterized in that an area defined by the output aperture is smaller than an area defined by said electron emitting portion.

26. An electric discharge element as in claim 25, characterized in that in operation the current density of electrons leaving the output aperture is larger than the current density of electrons emitted by the electron emitting portion of the electron generating means.

27. An electric discharge element as in claim 25, characterized in that in operation the ratio of current density to energy spread for electrons leaving the output aperture is larger than said ratio for electrons emitted by the electron emitting portion of the electron generating means.

28. An electric discharge element as in claim 14 or 15, including means for modulating the current of the electrons emitted by said electron generating means.

29. An electric discharge element as in claim 21, characterized in that said output aperture is provided in a longitudinally extending wall of the duct.

30. An electric discharge element as in claim 14 or 15, characterized in that a plurality of output apertures are provided in a longitudinally extending wall of the duct.

31. An electric discharge element as in claim 14 or 15, characterized in that electrode means is provided proximate the output aperture for:
   a. upon the application of a first voltage, electrically opening the aperture; and
   b. upon the application of a second voltage, closing the aperture.

32. An electric discharge element as in claim 30, characterized in that electrode menas is provided proximate the plurality of apertures for, upon the application of predetermined voltages, selectively controlling current flow through said apertures.

33. An electric discharge apparatus for operating as an electron source, comprising:
   a. electron generating means for emitting electrons;
   b. a plurality of longitudinally extending evacuable electron ducts, each having at least one inner surface defining a cavity which is in communication with the electron generating means for receiving electrons emitted by said means and having an output aperture for enabling transfer of electrons out of the duct, said at least one inner surface being formed, over a substantial length of the duct, from an insulating material having a secondary emission coefficient which is at least equal to one for a predetermined range of electron energies;
   c. field producing means positioned relative to the duct for producing within said cavity an electric field with a predetermined field strength for effecting the transport of electrons from the electron generating means to at least the vicinity of the output aperture by way of electron interactions with said inner surface of insulating material at energies within said predetermined range.

34. An electron discharge apparatus as claimed in claim 33 characterized in that said output apertures are disposed at ends of said longitudinally extending ducts.

* * * * *

UNITED STATES PATENT AND TRADEMARK OFFICE
CERTIFICATE OF CORRECTION

PATENT NO. : 5,270,611
DATED : Dec. 14, 1993
INVENTOR(S) : Gerardus G. P. Van Gorkom It is certified that error appears in the above-indentified patent and that said Letters Patent is hereby corrected as shown below:

```
Column 7, line 50, delete "to" after --proximate--.

Column 10, line 2, change "menas" to --means--.
```

Signed and Sealed this

Twenty-fifth Day of June, 1996

*Attest:*

BRUCE LEHMAN

*Attesting Officer*         *Commissioner of Patents and Trademarks*